United States Patent

Schnetker

(10) Patent No.: US 9,488,533 B2
(45) Date of Patent: Nov. 8, 2016

(54) SELF-LEARNING MONITORING SYSTEMS FOR ELECTRICAL DEVICES

(71) Applicant: Kidde Technologies, Inc., Wilson, NC (US)

(72) Inventor: Ted R. Schnetker, Rockford, IL (US)

(73) Assignee: Kidde Technologies, Inc., Wilson, NC (US)

(*) Notice: Subject to any disclaimer, the term of this patent is extended or adjusted under 35 U.S.C. 154(b) by 186 days.

(21) Appl. No.: 14/251,102

(22) Filed: Apr. 11, 2014

(65) Prior Publication Data

US 2015/0292958 A1 Oct. 15, 2015

(51) Int. Cl.

| | |
|---|---|
| *G01K 13/00* | (2006.01) |
| *G01K 1/00* | (2006.01) |
| *G01J 5/00* | (2006.01) |
| *G01R 31/00* | (2006.01) |
| *G01J 5/10* | (2006.01) |
| *G01R 31/34* | (2006.01) |
| *G01R 31/36* | (2006.01) |
| *G01R 31/40* | (2014.01) |
| *G01R 31/02* | (2006.01) |
| *G01R 31/06* | (2006.01) |

(52) U.S. Cl.
CPC .............. *G01K 13/00* (2013.01); *G01J 5/00* (2013.01); *G01J 5/10* (2013.01); *G01K 1/00* (2013.01); *G01R 31/008* (2013.01); *G01J 2005/0077* (2013.01); *G01K 2205/00* (2013.01); *G01R 31/027* (2013.01); *G01R 31/028* (2013.01); *G01R 31/06* (2013.01); *G01R 31/343* (2013.01); *G01R 31/3606* (2013.01); *G01R 31/40* (2013.01)

(58) Field of Classification Search
CPC .. G01J 5/10; G01J 2005/0077; G01K 13/00; G01K 2205/00; G01K 1/00; G01R 31/008
See application file for complete search history.

(56) References Cited

U.S. PATENT DOCUMENTS

| | | | | |
|---|---|---|---|---|
| 8,515,196 | B1* | 8/2013 | Hogasten | ........... H04N 5/23229 348/164 |
| 8,860,245 | B2* | 10/2014 | Saxena | ................... F02N 11/04 307/10.6 |
| 2009/0115419 | A1 | 5/2009 | Ueda et al. | |
| 2013/0079955 | A1 | 3/2013 | Masiello et al. | |
| 2013/0260188 | A1 | 10/2013 | Coates | |
| 2014/0125121 | A1* | 5/2014 | Edwards | ............... H02J 7/1446 307/9.1 |

OTHER PUBLICATIONS

Search Report and Opinion issued by the European Patent Office on Jul. 1, 2015 for European Patent Application No. 15162162.

* cited by examiner

*Primary Examiner* — Marcus Taningco
*Assistant Examiner* — Mindy Vu
(74) *Attorney, Agent, or Firm* — Locke Lord LLP; Scott D. Wofsy; Christopher J. Cillié

(57) ABSTRACT

A method of monitoring an electrical device includes receiving an operational condition of an electrical device, receiving a measurement indicative of a thermal parameter of the electrical device corresponding to the operational condition, and storing the measurement in memory in association with the operational condition. A system for monitoring electrical devices includes a processor communicative with a memory and the memory has instructions recorded thereon that, when read by the processor, cause the processor to execute the method.

12 Claims, 4 Drawing Sheets

SELF-LEARNING MONITORING SYSTEMS FOR ELECTRICAL DEVICES

BACKGROUND OF THE INVENTION

1. Field of the Invention

The present disclosure relates generally to mechanical and electrical equipment monitoring, and more specifically to monitoring systems for such devices.

2. Description of Related Art

Conventional aircraft typically include one or more systems for powering aircraft subsystems and devices, such as electric power generation and distribution systems, bleed air systems, and hydraulic systems. Hydraulic systems generally pressurize and cycle high-pressure fluid to actuators operatively associated with landing gear and control surfaces. Bleed air systems generally provide pressurized air extracted from aircraft engine compressors for operating systems such as environmental control and de-icing systems. Electric systems generally produce and distribute electrical power for subsystems and electrical devices such as aircraft lighting, cockpit electrics, and certain types of de-icing devices.

Development of 'more electric' aircraft architectures has seen the implementation of increasingly sophisticated electrical power and distribution systems. It has also seen reductions in the size and scale of the bleed air and hydraulic systems traditionally employed on aircraft, in part due to the weight advantage enjoyed by electrical cabling over hydraulic conduit and bleed air ducting, and in part because of development of electrical devices that perform functions traditionally done by bleed air or hydraulic devices. These aircraft architectures more typically include electrical systems with higher power densities and higher voltages than in traditional architectures. Higher power densities and voltages have in turn increased the importance of conventional systems and methods for electrical system monitoring, such as remote fault detection through current and voltage sampling and fire detection systems that have traditionally relied upon on direct sensing for fault detection, such as smoke and fire detectors.

Such conventional methods and systems have generally been considered satisfactory for their intended purpose. However, there is still a need in the art for improved electrical system monitoring systems. The present disclosure provides a solution for this need.

SUMMARY OF THE INVENTION

A method of monitoring an electrical device includes receiving an operational condition of an electrical device, receiving a measurement indicative of a thermal parameter of the electrical device corresponding to the operational condition, and storing the measurement in memory in association with the operational condition.

In certain embodiments the operational condition can correspond to an aircraft-operating regime, such as taxiing, takeoff, cruise, or landing. The operational condition can correspond to one or multiple operational conditions including aircraft altitude, external air temperature, or engine power. The operational condition can also correspond to a load on the electrical device.

It is contemplated that the measurement can be acquired using a sensor housed externally or within an interior of the electrical device. The measurement can include an image of an interior surface of an electrical device. The measurement can include a relative intensity map of an interior surface of the electrical device, such as with an infrared or ultraviolet charged coupled device. The image can be a scan or video the electrical device from an interior or an exterior of the monitored electrical device.

In accordance with certain embodiments, the operational condition can be a first operational condition and the method can further include receiving a second operational condition and storing the second measurement in association with the second operational condition in memory. The measurement can be a first measurement and the method can include determining a limit using the first measurement, receiving a second measurement while the electrical device is in the operational condition, comparing the second measurement with the determined limit, and providing a response if the measurement is outside the determined limit. The response can include providing an alert, shedding load or any other suitable response. Determining the limit can include statistically determining the limit using the first and second measurements, or many repeated measurements such as by iteratively updating the limit using at least the second measurement and/or a subsequently received measurement.

It is also contemplated that in certain embodiments the method can include determining a second limit using the second measurement, receiving an operational condition selected from a group including the first and second operational conditions, and receiving a third measurement while the electrical device is in the operational condition selected from the group including the first and second operational conditions. One of the first and second limits can be selected based on the operational condition selected from the group including the first and second operational conditions, and a response can be provided if the third measurement is outside of the selected limit. The method can be a computer-implemented method. A system can include a processor communicative with a memory having instructions recorded thereon that, when read by the processor, implement the above-described method.

It is contemplated that in certain embodiments statistical methods can be employed to determine limits peculiar to a specific electrical device. Change in performance of the electrical device can thereafter be identified through application of decision control rules, such as Westinghouse rules for example, for detecting out-of-control or non-random condition(s) of the electrical device.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 4A is a schematic view of sensor operatively associated with the system of FIG. 1, showing the sensor scanning a surface of an electrical device, according to an embodiment; and.

DETAILED DESCRIPTION OF THE PREFERRED EMBODIMENTS

Figure 1:
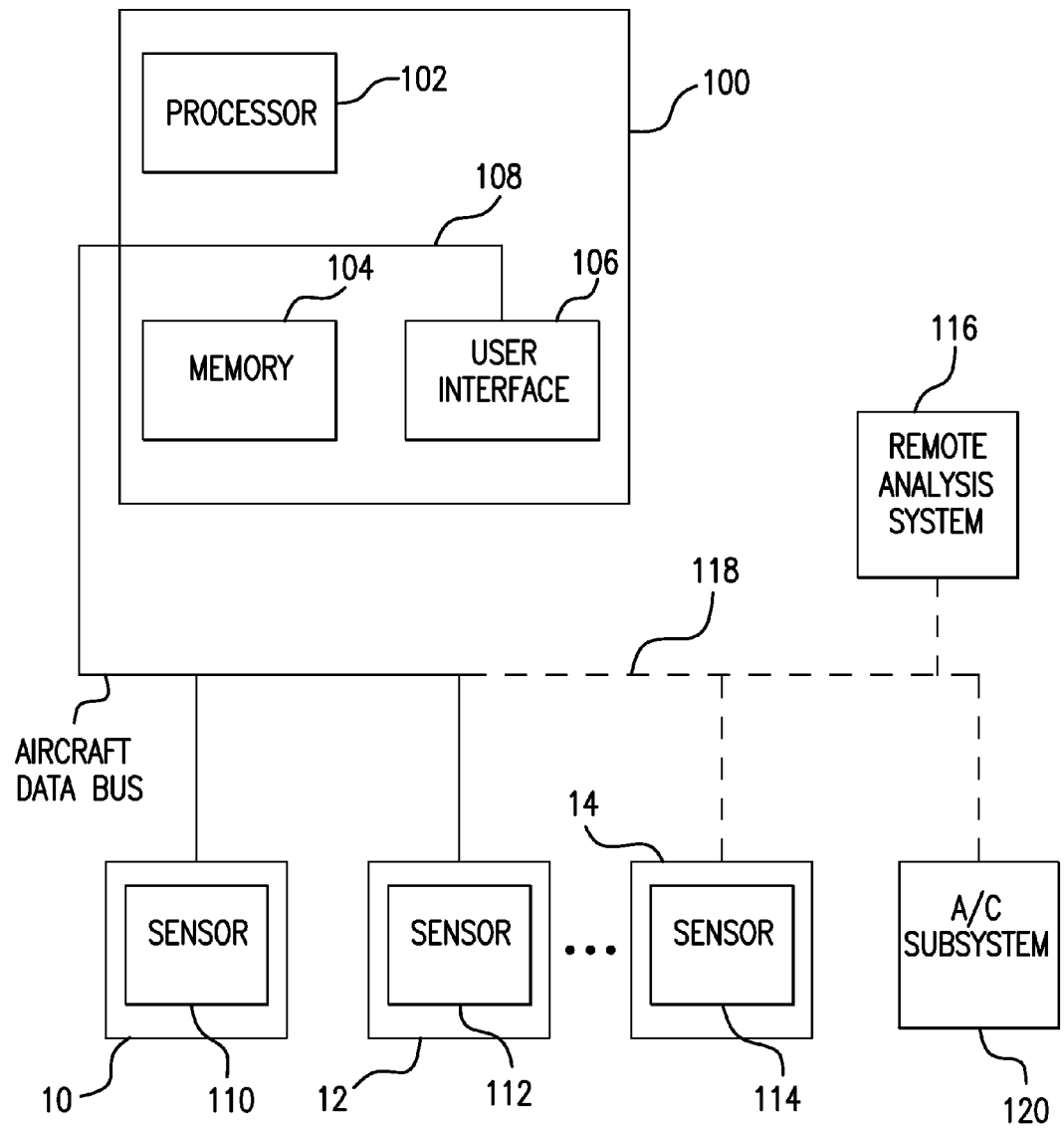
FIG. 1 is a schematic view of an exemplary embodiment of a self-learning monitoring system constructed in accordance with the present disclosure, showing the system elements.

Reference will now be made to the drawings wherein like reference numerals identify similar structural features or aspects of the subject disclosure. For purposes of explanation and illustration, and not limitation, a partial view of an exemplary embodiment of the learning monitor in accordance with the disclosure is shown in FIG. 1 and is designated generally by reference character 100. Other embodiments of the learning monitor in accordance with the disclosure, or aspects thereof, are provided in FIGS. 2-4B, as will be described. The systems and methods described herein can be used for monitoring electrical devices, such as in aircraft, ships, cars, trucks, or elevators for example.

With reference to FIG. 1, monitoring system 100 in accordance with the present disclosure is shown schematically. Monitoring system 100 includes a processor 102 communicative with a memory 104 and a user interface 106 through communication bus 108. Processor 102 is a computer processor configured for executing instructions read from a non-transitory machine-readable memory. Memory 104 is a non-transitory machine-readable memory having instructions recorded on it that, when read by a processor, cause the processor to undertake one or more actions in a method 200 for monitoring electrical devices (shown in FIG. 2). User interface 106 is device for user interaction with system 100, such as a display, keypad or controller, which a user can interact with monitoring system 100. Communication bus 108 is data configured for relaying information between connected components.

Monitoring system 100 is optionally in communication with an analysis system 116. Analysis system 116 is configured and operative for storing measurements, limits, and analyzing measurement and limits using operational conditions and measurements obtained from monitoring system 100. Monitoring system 116 can be remote from system 100, such as a ground station communicative with monitoring system through a satellite data link. Analysis system 116 can also be a module communicative with processor 102.

Monitoring system 100 is in communication with at least one sensor 110 for detecting electrical performance changes from established limits or patterns using a measurement indicative of a thermal parameter of an electrical device 10. In this respect, monitoring system 100 extends protection afforded by conventional systems to include both transient thermal events as well as relatively subtle changes to temperature patterns exhibited by electrical device 10 and allows for limits to be self-learned for a specific electrical device as installed on a given aircraft, for example, as well as other equipment systems being monitored. Monitoring system 100 can further include input(s) on operating mode(s) and states from other aircraft equipment and subsystems, such as avionics or engine control systems. The former, such as overcurrent and arcing events, can lead to immediate loss of functionality or damage. The latter, while not necessarily accompanied by immediate functionality loss, can be of diagnostic interest as early indication of future loss of functionality or damage. This allows monitoring system 100 to anticipate electrical problems as well as observe electrical problems, thereby making systems reliant on electrical devices, such as aircraft employing 'more electric' and 'higher voltage' aircraft architectures, more reliable.

As illustrated if FIG. 1, monitoring system 100 is in communication with first sensor 110, a second sensor 112, and a third sensor 114. First, second and third sensors 110, 112, and 114 are in communication with processor 102, memory 104, and user interface 106 through a portion of an aircraft data bus coupled to communication bus 108. First, second and third sensors 110, 112, and 114 and are configured and operative for acquiring measurements indicative of a thermal parameter of electrical devices and communicating the measurements to monitoring system 100 through the aircraft data by and communication bus 108. At least one of the sensors, as illustrated by the dashed lines connecting third sensor 114 to monitoring system 100, is additionally in communication with processor 102 over a wireless link 118. Each of the first, second, and third sensors 108, 110, and 112 are associated with an electrical device, first sensor 110 being associated with electrical device 10, second sensor 112 being associated with electrical device 12, and third sensor 114 being associated with electrical device 14. Electrical devices 10, 12, 14 are electrical devices such as batteries, power panels, power distribution boxes, generators, power rectifiers, power inverters, power converters, generators operatively associated with auxiliary power units or main engines, motor controllers, or the like. Monitoring system 100 may also be in communication with other equipment subsystems, such as an aircraft subsystem 120, to determine equipment operating modes, states, or external conditions. As will be appreciated by those skilled in the art, the number and arrangement of sensors shown in FIG. 1 is for illustration purposes only and in non-limiting. As will also be appreciated, aircraft subsystem 120 can be a subsystem such as an engine controller or aircraft avionics for example.

As will be appreciated, current flowing through electrical devices generates heat through resistive heating. As will also be appreciated, current flow in some types of electrical systems ebbs and flows based on the operational conditions imposed on the system. In aircraft electrical systems for example, different electrical devices carry different electrical loads based on flight regime and produce different amounts of heat in different regimes. Moreover, since not all electrical devices inhabit environmentally controlled spaces, thermal characteristics of aircraft electrical systems can change based on operational conditions such as external temperature and altitude. Application of a limit, e.g. a peak temperature or total indicted range for example, that is specific to a given operational conditions can remove the influence of traversing a succession of different operational conditions during a time interval while measurements are being acquired, thereby making discernable relatively subtle current flow changes that are potentially indicative of future loss of functionality or failure.

Sensor 110 is a non-scanned sensor, and as illustrated is a thermocouple directly connected to electrical device on an interior of the device, such as interior portion of a battery housing or power cable. Sensor 110 is configured and operable to measure temperature of electrical device 10. The temperature measurements have a range influenced by the operational condition of electrical device 10, for example whether a battery is being charged or being discharged, or is charged or discharged state.

Sensor 112 is an infrared charged coupled detector configured and operative for acquiring measurements indicative current driven temperature changes in electrical device 12. The acquired measurements are infrared images of an internal surface of a current carrying device, such as a printed wire board, processor, or wiring for example. The images show relative amounts of thermal radiation from the surface at locations within the field of view sensor 112 indicative of current flow and power usage.

Sensor 114 is an ultraviolet (UV) charged coupled detector configured and operative for acquiring measurements in the form of a UV image of an internal surface of electrical device 14. Since electrical arcs emit UV radiation, acquiring UV images within electrical device 14 can capture an arcing fault within the field of view of sensor 114 as it develops and prior to the arcing damaging the electrical device sufficiently to cause loss of functionality. The image can be an XY scan or video (shown in FIG. 4A) of ultraviolet radiation emitted by a surface 12 (shown in FIG. 4A) of electrical device 14.

Figure 4A:
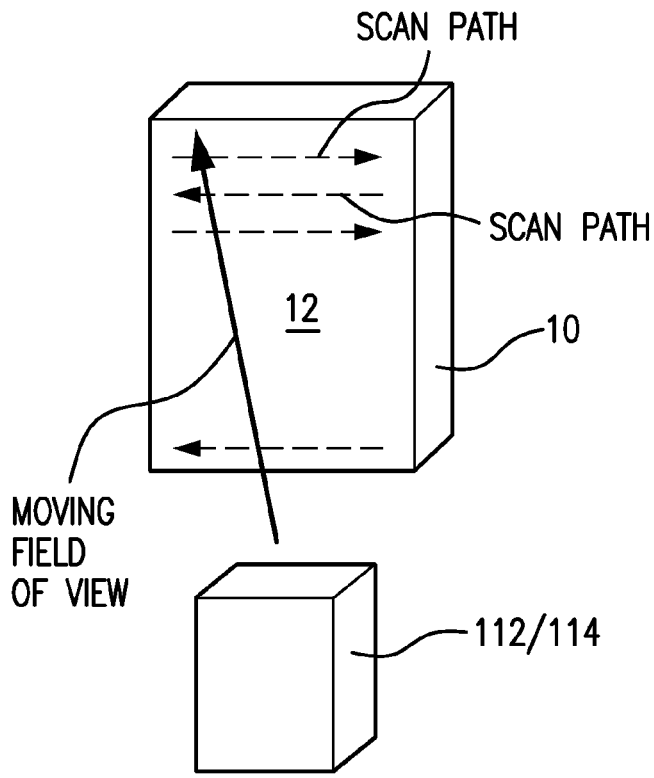
Figure 4B:
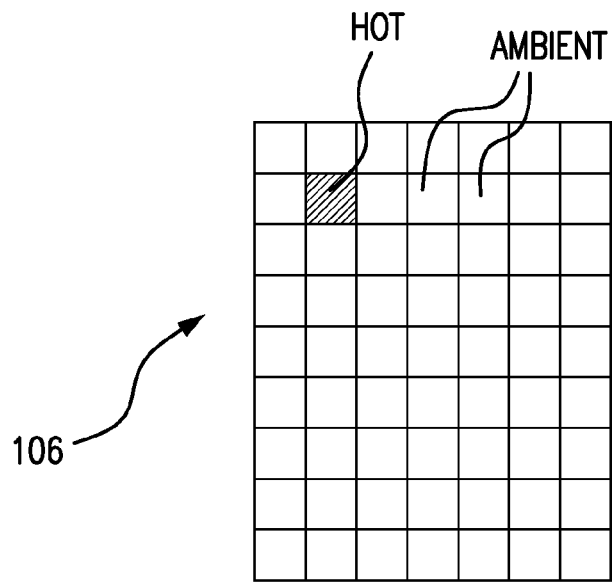
FIG. 4B is a schematic view of a display of an image or video from the scans of FIG. 4A, showing a hot spot set sensor operatively associated with the system of FIG. 1, showing the sensor scanning a surface of an electrical device, according to an embodiment.

An example scanning method is shown in FIG. 4A wherein sensor 112 or sensor 114 are scanned across a surface 12 of electrical device 10 by sweeping a sensor field of view (e.g. a moving field of view) across surface 12 and recording an intensity value in each pixel of the scanning field. Monitoring system 100 then maps output of sensor 112 or 114 and displays the map as a thermal map or video on user interface 106 (shown in FIG. 4B). This allows for viewing regions of relatively high thermal activity (i.e. a hot spot) so as to contrast with the ambient background. Images acquired by sensor 112 or 114 can be scans or video of surface 12.

Monitoring system 100 can include capability to play back data received from sensor 10, sensor 12, and/or second 14. With respect to sensor 12 or sensor 14, received data can be played back as scanned infrared or ultraviolet images as time lapse still image format, a moving series of still images format, or as a continuous video or graphical representations format based on a sampling rate of the sensor associated with the electrical device. A given format, e.g. video, can include a plurality of colors correlated to temperature of the monitored electrical devices, e.g. electrical device 10, electrical device 12, or electrical device 14. A given format can also include flight and operating condition data represented in an accompanying "scrolling window" or other display type. A given format can further include a "transparent color" or other display indicating limits associated with a scanned area simultaneously over time along accompanying actual scanned or recorded sensor values. Alternatively or additionally, a given format can also include a "difference" image or graphical representation of the scanned values versus limit values over time. This potentially allows for determining changes in performance of the monitored electrical device, e.g. electrical device 10, electrical device 12 or electrical device 14. It can also allow engineering and maintenance personnel to view the thermal variation of sensor-monitored areas versus limits and operating conditions to assist in limit setting, fault identification and understanding of temperature characteristics of monitored equipment during operational, testing, and maintenance conditions.

In embodiments, monitoring system 100 can simultaneously display imagery showing a first monitored electrical device, e.g. a first electrical device selected from a group including electrical device 10, electrical device 12, or electrical device 14, with a imagery showing a second monitored electrical device, e.g. a second electrical device selected from the group including electrical device 10, electrical device 12, or electrical device 14. This allows for monitoring a plurality of similar (or different) monitored electrical devices from a single vehicle or larger system. In certain embodiments, monitoring system 100 can also simultaneously display imagery showing a first monitored electrical device, e.g. a first electrical device selected from a group including electrical device 10, electrical device 12, or electrical device 14, with a imagery showing similar equipment in the similar vehicles or larger systems. In this respect monitoring system 100 can display "playback" of graphical or video images of selected equipment, for example "Forward right side Transformer Rectifier Unit #1" in multiple aircraft tail numbers experiencing the same flight and operating conditions. This provides a frame of reference for received sensor data from which a specific aircraft exhibiting unanticipated variation in thermal performance can potentially be identified.

An example would be use of this functionality to obtain 'baseline' video and data during established flight test conditions of a "baseline" aircraft, then comparison of each new production aircraft's equipment thermal response during identical flight test conditions conducted on each aircraft produced as part of the acceptance testing of the new aircrafts. This comparison can be done using graphical and/or statistical analysis of the recorded sensor data.

Figure 2:
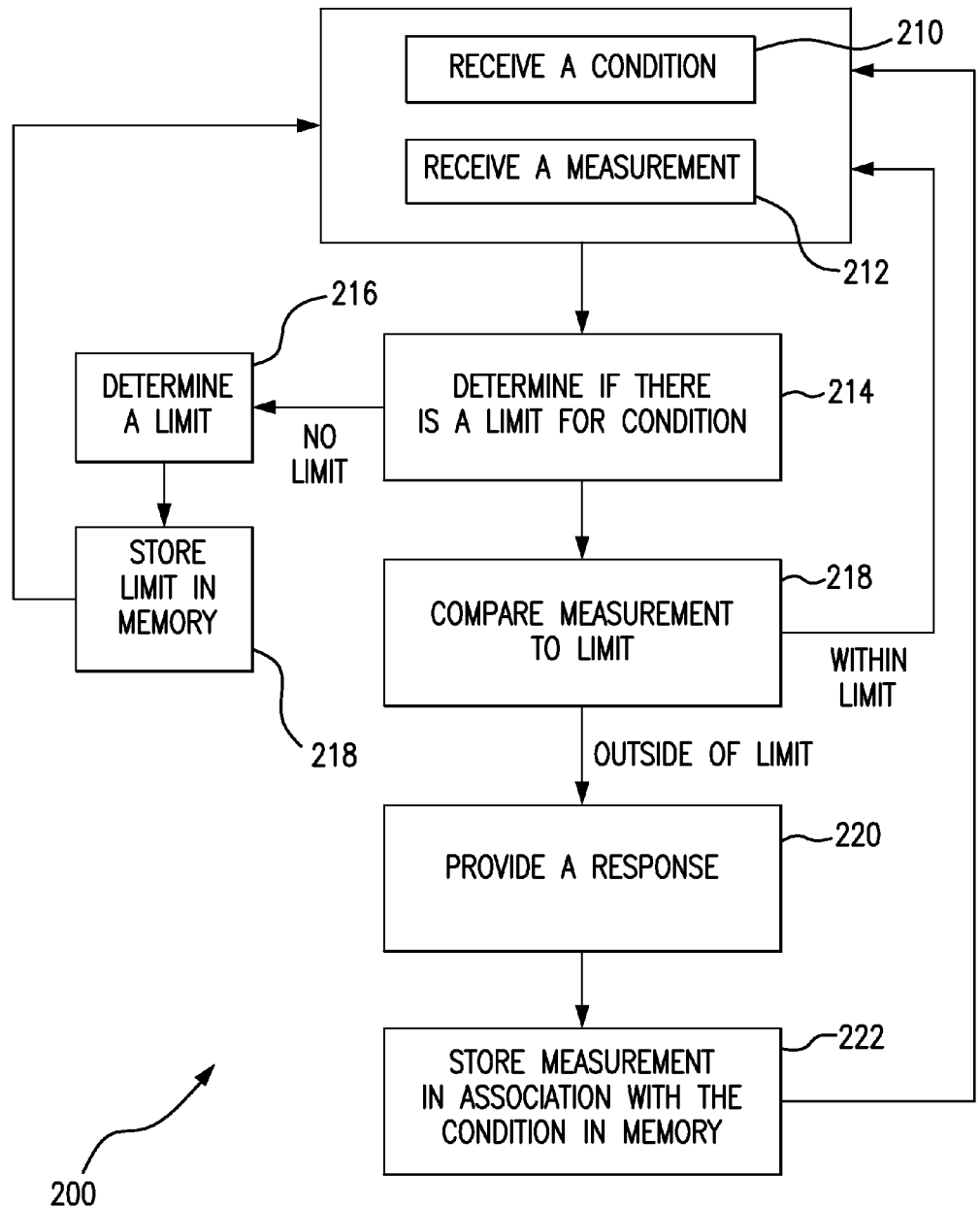
FIG. 2 is a flow chart of a method for monitoring an electrical device, showing steps of the method, according to an embodiment.

With reference to FIG. 2, a method 200 of monitoring an electrical device is shown. Method 200 includes receiving 210 an operational condition of an electrical device, receiving a measurement indicative of a thermal parameter of the electrical device while in the operational condition 212, determining 214 if there is limit for the received measurement while in the operational condition, comparing 218 the measurement to the limit, providing a response 220, and storing 222 the measurement in association with the operational condition in memory. This can provide prognostic health monitoring benefits as electrical devices with latent reliability issues are identifiable prior to failure or loss of functionality.

Receiving 210 an operational condition includes receiving an indication of relative current flowing through the electrical device as influenced by aircraft operating regime, such as taxiing, takeoff, cruise, and landing. The operational condition can also be an operational condition of an aircraft, such as flight altitude, external air temperature, engine power setting, or electrical load on the electrical device. As will be appreciated by those skilled in the art, different flight regimes and operational conditions impose different electrical requirements on aircraft electrical devices. As will also be appreciated, latent (or prospective) failures may be more readily discernable in one flight regime or operational condition than other operational conditions.

Receiving 212 a measurement indicative of a thermal parameter of the electrical device includes receiving data from at least one of first, second, and third sensors 110, 112, and 114 (shown in FIG. 1). The received measurement is indicative of a thermal parameter of respective electrical device, and is either a temperature measurement (e.g. received from first sensor 110) or an infrared or UV image (e.g. received from second or third sensor 112 or 114).

Determining 214 if there is a limit for the operational condition includes searching for the operational condition and an associated limit in memory 104. In the event that there is a limit for the operational condition, method 200 includes determining 216 a limit for the operational condition and storing 218 the determined limit in memory 104. In this respect, once integrated into an aircraft and placed in communication with a sensor network, this allows for monitoring system 100 to learn the normal (e.g. expected) operating thermal parameters of monitored electrical devices for a plurality of operational conditions. The operational conditions can include aircraft flights regimes, aircraft operational conditions, or electrical load carried by the monitored device. Moreover, once integrated in to an aircraft architecture, monitoring system 100 characterizes the specific aircraft as the aircraft encounters operational conditions identifiable to monitoring system 100 by determining limits for measurements acquired from monitored electrical in the encountered operational condition in association with the encountered operational condition. This populates memory 104 with a limit set that provide an operational condition-specific context for determining whether a given received measurement is normal or aberrant, allowing for recognition of electrical issues that may be cognizable only under a single of limited set of operational conditions. As will be appreciated by those skilled in the art, the limit set can be unique to a specific aircraft (i.e. a particular tail number), thereby providing electrical device monitoring for the specific aircraft configuration as originally built or as subsequently modified.

In the event that there is a limit for the operational condition in memory, method 200 includes a step 218 for comparing the received measurement to the limit and a step 220 for providing a response in the event that the received measurement is outside to the limit. Examples of responses include providing an alert to user interface 106, shedding electrical load from the monitored electrical device, or altering onboard or off-board systems. It is to be appreciated that these responses can advise crew, maintenance, and monitoring personnel of detected measurements. These can also advise of the detected temperature or the statistical learned parameters expected for temperature at a location for an operational condition of interest.

In certain embodiments, a step 216 for determining a limit includes converting the received measurement into a limit. For example, monitoring system 100 can store a set of measurements in memory 104 and generate a statistical limit based on the measurement set. In embodiments, the measurement is an image and method 200 includes relating the image to a limit. For example, monitoring system 100 can pixelate the acquired image into a two dimensional array of subareas with respective subarea average intensity. The set of image subarea intensities can them be manipulated for comparison with the limit. Examples of manipulations include determining a maximum intensity of the image, determining the total indicated intensity range indicated in the image, and determining the standard deviation of the intensities indicated in the image. It is contemplated that coordinates of a point of peak intensity in the image can be acquired and stored in memory as the limit. As will be appreciated, comparing 216 the measurement to the limit in such embodiments also entails corresponding conversions of received measurements for comparison with the determined limit. This provides a context for appreciating subtle changes in the performance of the monitored electrical device indicative of prospective reliability issues through changes in acquired imagery.

Figure 3:
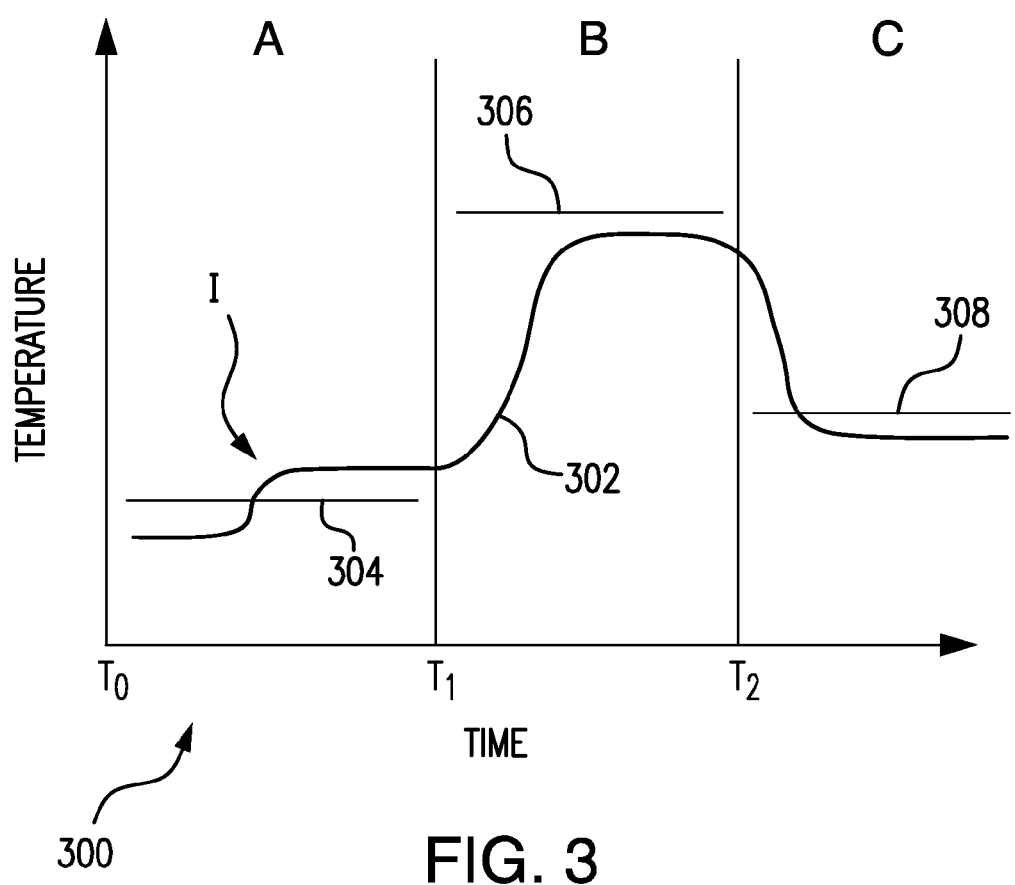
FIG. 3 is a graphical representation measurements indicative of a thermal parameter of an electrical device acquired over time as the electrical device is exposed to a succession of operational conditions, showing the measurements in relation to the operational condition-specific limits for the succession of operational conditions.

With reference to FIG. 3, a chart 300 is shown. Chart 300 illustrates temperature versus time for measurements 302 of a thermal parameter indicative of a thermal parameter of an electrical device. The electrical device transitions through a succession of operational conditions over the illustrated time interval, the electrical device exposed to a first operational condition A between $t_0$ and $t_1$, a second operational condition B between $t_1$ and $t_2$, and a third operational condition C from $t_2$ onwards. A first limit 304 shows expected electrical performance in first operational condition A, a second limit shows expected electrical performance in second operational condition B, and a third limit shows expected electrical performance in third operational condition C. Notably, a departure I from within limit performance is discernable when the measurements are viewed with respect to first limit 304 only.

More-electric aircraft architectures typically assign significant aircraft functionality to electrical equipment including flight critical functions. This makes more important systems and methods for prognostic health monitoring (PHM) for identifying electrical devices that may become prone to failure prior to performance degradation reaching non-functionality, such as when a high power electrical connection loosens over time due vibration and thermal cycling associated with operation. The disclosure provides a solution to this and other types of potential reliability problems as they emergent, and prior to loss of functionality.

The methods and systems of the present disclosure, as described above and shown in the drawings, provide for self-learning monitoring systems and methods with superior properties including identification of performance change in advance of over-temperature events or arcing events in electrical devices. In particular, such systems and methods can anticipate failure, fire, or arcing risk related to overheating events in aircraft electronics or system components. This can allow for recognizing a developing as it develops manifests but prior to loss of functionality. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method of monitoring an electrical device, comprising:
  receiving a first operational condition of an electrical device, wherein the first operational condition corresponds to an aircraft operating regime;
  receiving a first measurement indicative of a thermal parameter of the electrical device while in the first operational condition;
  determining a first limit using the first measurement;
  storing the first limit in association with the first operational condition in memory;
  receiving a second operational condition of the electrical device, wherein the second operational condition is different than the first operational condition;
  receiving a second measurement indicative of the thermal parameter while of the electrical device while in the second operational condition;
  determining a second limit using the second measurement; and
  storing the second limit in association with the second operational condition in memory,
  wherein the first measurement and the second measurement are acquired by scanning an interior surface the electrical device using an infrared or ultraviolet charged coupled device.

2. A method as recited in claim 1, wherein the aircraft operating regime comprises an aircraft operating regime selected from a group comprising taxiing, takeoff, cruise, and landing.

3. A method as recited in claim 1, wherein the aircraft operating regime corresponds to at least one of an aircraft altitude, external air temperature or engine power setting, load on the electrical device, or other equipment condition.

4. A method as recited in claim 1, further comprising:
receiving a second measurement while the electrical device is in the first operational condition;
comparing the second measurement with the first limit; and
providing a response if the measurement is outside the first limit.

5. A method as recited in claim 4, wherein determining the first includes statistically determining a limit using the first and second measurements.

6. A method as recited in claim 4, wherein providing a response includes providing an alert.

7. A method as recited in claim 4, wherein providing a response includes load shedding.

8. A method as recited in claim 1, wherein the limit is a first limit and the method further comprises:
receiving an operational condition selected from a group including the first and the second operational conditions;
receiving a third measurement in the received operational condition;
selecting one of the first and second limits based on the received operational condition;
comparing the third measurement with the selected limit; and
providing a response if the third measurement is outside the selected limit.

9. A method as recited in claim 1, wherein receiving a measurement further comprises acquiring an image of the interior surface of the electrical device.

10. A method as recited in claim 1, wherein receiving a measurement further comprises acquiring a relative intensity map of an interior surface the electrical device using the infrared or ultraviolet charged coupled device.

11. A non-transitory, machine-readable medium with instructions recorded thereon that, when read by a processor causes the processor to:
receive a first operational condition of an electrical device, wherein the first operational condition corresponds to an aircraft operating regime;
receive a first measurement indicative of a thermal parameter of the electrical device while in the first operational condition;
determine a first limit using the first measurement;
store the first limit in association with the first operational condition in memory;
receive a second operational condition of the electrical device, wherein the second operational condition is different than the first operational condition;
receive a second measurement indicative of the thermal parameter while of the electrical device while in the second operational condition;
determine a second limit using the second measurement; and
store the second limit in association with the second operational condition in memory
wherein the first measurement and the second measurement are acquired by scanning an interior surface the electrical device using an infrared or ultraviolet charged coupled device.

12. A medium as recited in claim 11, wherein the instructions further cause the processor to:
receive an operational condition selected from a group including the first and second operational conditions;
receive a third measurement indicative of the thermal parameter while the electrical device is in the operational condition;
select one of the first and second limits based on the operational condition;
compare the third measurement with the selected limit; and
provide a response if the measurement is outside the selected limit.

* * * * *